(12) United States Patent
Niki et al.

(10) Patent No.: US 9,208,830 B2
(45) Date of Patent: Dec. 8, 2015

(54) SEMICONDUCTOR MEMORY DEVICE

(71) Applicant: KABUSHIKI KAISHA TOSHIBA, Tokyo (JP)

(72) Inventors: Yusuke Niki, Tokyo (JP); Keiichi Kushida, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 112 days.

(21) Appl. No.: 14/016,189

(22) Filed: Sep. 2, 2013

(65) Prior Publication Data

US 2014/0104915 A1   Apr. 17, 2014

(30) Foreign Application Priority Data

Oct. 11, 2012   (JP) .................................. 2012-226454

(51) Int. Cl.
  *G11C 5/04*   (2006.01)
  *G11C 5/14*   (2006.01)
  *G11C 11/413*   (2006.01)
  *G11C 11/419*   (2006.01)
  *G11C 7/18*   (2006.01)

(52) U.S. Cl.
  CPC ................ *G11C 5/14* (2013.01); *G11C 11/413* (2013.01); *G11C 11/419* (2013.01); *G11C 7/18* (2013.01)

(58) Field of Classification Search
  CPC ...... G11C 5/14; G11C 11/419; G11C 11/413; G11C 7/18
  USPC ................................ 365/154, 189.01, 189.09
  See application file for complete search history.

(56) References Cited

U.S. PATENT DOCUMENTS

2012/0127782 A1* 5/2012 Moriwaki ..................... 365/154

FOREIGN PATENT DOCUMENTS

JP       2007-273007       10/2007

* cited by examiner

*Primary Examiner* — Richard Elms
*Assistant Examiner* — Mohammed A Bashar
(74) *Attorney, Agent, or Firm* — Patterson & Sheridan, LLP (57) ABSTRACT

A semiconductor memory device includes a memory cell, a pair of local bit lines connected to the memory cell, first and second transistors, one end of the current channel of each connected to a power supply and the other end of the current channel of each connected to one of the local bit lines, third and fourth transistors, one end of the current channel of each connected to one of the local bit lines, the other end of the current channel of each connected to one of the global bit lines, fifth and sixth transistors, one end of the current channel of each connected to one of the global bit lines and the other end of the current channel of which connected to the power supply. The device further includes a control unit configured to control the transistors.

19 Claims, 9 Drawing Sheets

WRITING OPERATION     READING OPERATION (a) SELECTED COLUMN   (b) NOT SELECTED COLUMN   (c) SELECTED COLUMN   (d) NOT SELECTED COLUMN

FIG. 8A

|  | LBLT | LBLC | GBLT | GBLC |
|---|---|---|---|---|
| SELECTED Read | $V_{DD}-V_T$ | $V_{DD}-V_T$ | $V_{DD}$ | $V_{DD}$ |
| SELECTED Write | $V_{DD}-V_T$ | $V_{DD}-V_T$ | $V_{DD}$ | $V_{DD}$ |
| NOT SELECTED Read | $V_{DD}-V_T$ | $V_{DD}-V_T$ | $V_{DD}$ | $V_{DD}$ |
| NOT SELECTED Write | $V_{DD}-V_T$ | $V_{DD}-V_T$ | $V_{DD}$ | $V_{DD}$ |

FIG. 8B

|  | LBLT | LBLC | GBLT | GBLC |
|---|---|---|---|---|
| SELECTED Read | $V_{DD}-V_T$ | $V_{DD}-V_T$ | $V_{DD}-V_T$ | $V_{DD}-V_T$ |
| SELECTED Write | $V_{DD}-V_T$ | $V_{DD}-V_T$ | - | - |
| NOT SELECTED Read | $V_{DD}-V_T$ | $V_{DD}-V_T$ | - | - |
| NOT SELECTED Write | $V_{DD}-V_T$ | $V_{DD}-V_T$ | - | - |

|  | LBLT | LBLC | GBLT | GBLC |
|---|---|---|---|---|
| SELECTED Read | $V_{DD}-V_T$ | $V_{DD}-V_T$ | $V_{DD}-V_T$ | $V_{DD}-V_T$ |
| SELECTED Write | - | - | - | - |
| NOT SELECTED Read | $V_{DD}-V_T$ | $V_{DD}-V_T$ | - | - |
| NOT SELECTED Write | $V_{DD}-V_T$ | $V_{DD}-V_T$ | - | - |

SEMICONDUCTOR MEMORY DEVICE

CROSS-REFERENCE TO RELATED APPLICATION

This application is based upon and claims the benefit of priority from Japanese Patent Application No. 2012-226454, filed Oct. 11, 2012, the entire contents of which are incorporated herein by reference.

FIELD

Embodiments described herein relate generally to a semiconductor memory device.

BACKGROUND

A semiconductor memory device including a CMOS (complementary metal-oxide semiconductor) type SRAM (static random access memory) is known.

DETAILED DESCRIPTION

In general, according to one embodiment, a semiconductor memory device includes a memory cell, which may be a volatile memory cell, connected to first and second local bit lines, and a number of transistors. A first transistor has a current channel (source-drain pathway) connected to a power supply voltage and the first local bit line. A second transistor has a current channel connected to the power supply voltage and the second local bit line. The gates of the first and second transistor are electrically connected. The device further includes a third transistor with a current channel connected to the first local bit line and a first global bit line, and a fourth transistor with a current channel connected to the second local bit line and a second global bit line. The gates of the third and fourth transistors are electrically connected. The device further includes a fifth transistor with a current channel connected to the first global bit line and the power supply voltage and a sixth transistor with a current channel connected to the second global bit line and the power supply voltage. The gates of the fifth and sixth transistors are electrically connected. A control unit is configured to supply control signals for controlling the first through sixth transistors for data reading and writing operations.

Embodiments are hereinafter described with reference to the drawings. Each of the drawings is only a schematic or conceptual figure, therefore the depicted relationships between the thickness and width of each of the parts, the specific relative ratio among the sizes of the respective components, and other conditions are not necessarily equivalent to the actual ones. The identical parts may, in reality, have different dimensions or ratios even if depicted with the same dimensions or ratios in each of the figures.

Elements in this specification and the respective figures similar to elements already described with reference to the drawings are given similar reference numbers, and the same detailed description is not repeated.

(First Embodiment)

[Structure of Semiconductor Memory Device]

Figure 1:
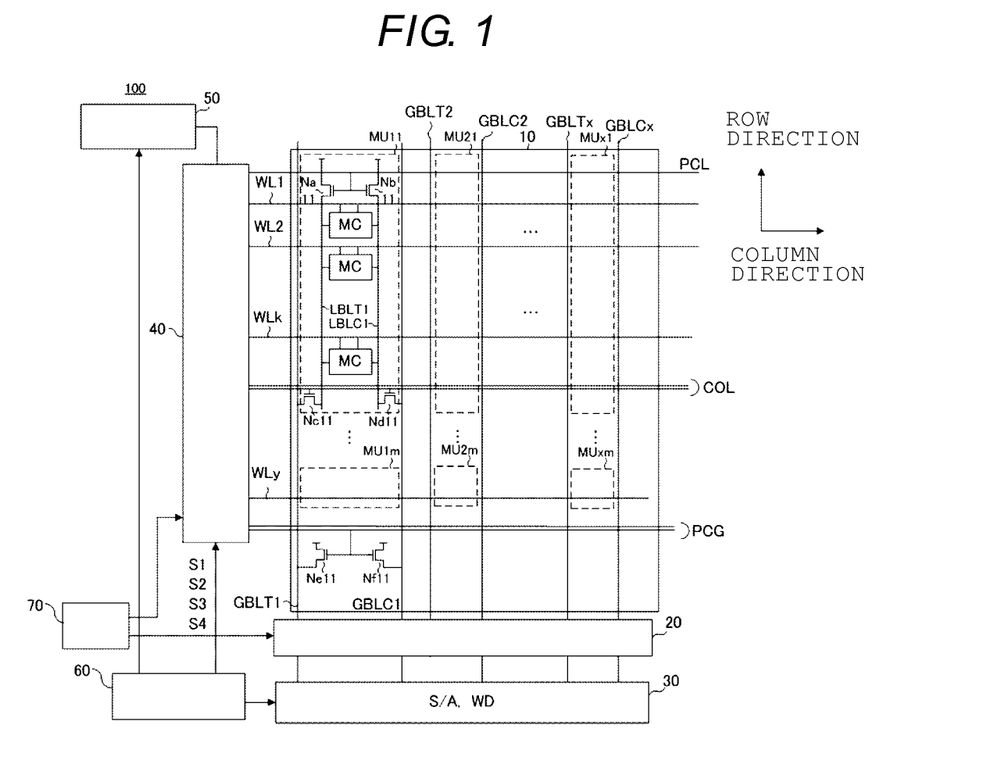
FIG. 1 depicts the structure of a semiconductor memory device according to a first embodiment.

The structure of a semiconductor memory device according to a first embodiment is hereinafter described with reference to a block diagram in FIG. 1. As illustrated in FIG. 1, a semiconductor memory device 100 in this embodiment primarily includes a memory cell array 10, a column selector 20, sense amplifier and write driver 30 (represented by S/A and WD in FIG. 1), a row decoder 40, a voltage generating circuit 50, a control circuit 60, and an address buffer 70.

<Memory Cell Array 10>

The memory cell array 10 includes a plurality of memory units MU11 through MUxm (x, m: natural number). The memory units MU11 through MUxm are arranged in matrix. The memory units MU11 through MUxm are hereinafter collectively referred to as memory units MU when the memory units do not need to be differentiated.

As illustrated in FIG. 1, the plural memory units MUs connect with global bit lines GBLT and GBLC. For example, the memory units MU11 through MU1m are between a global bit line GBLT1 and a global bit line GBLC1 and connect with the global bit line GBLT1 and the global bit line GBLC1.

Figure 2:
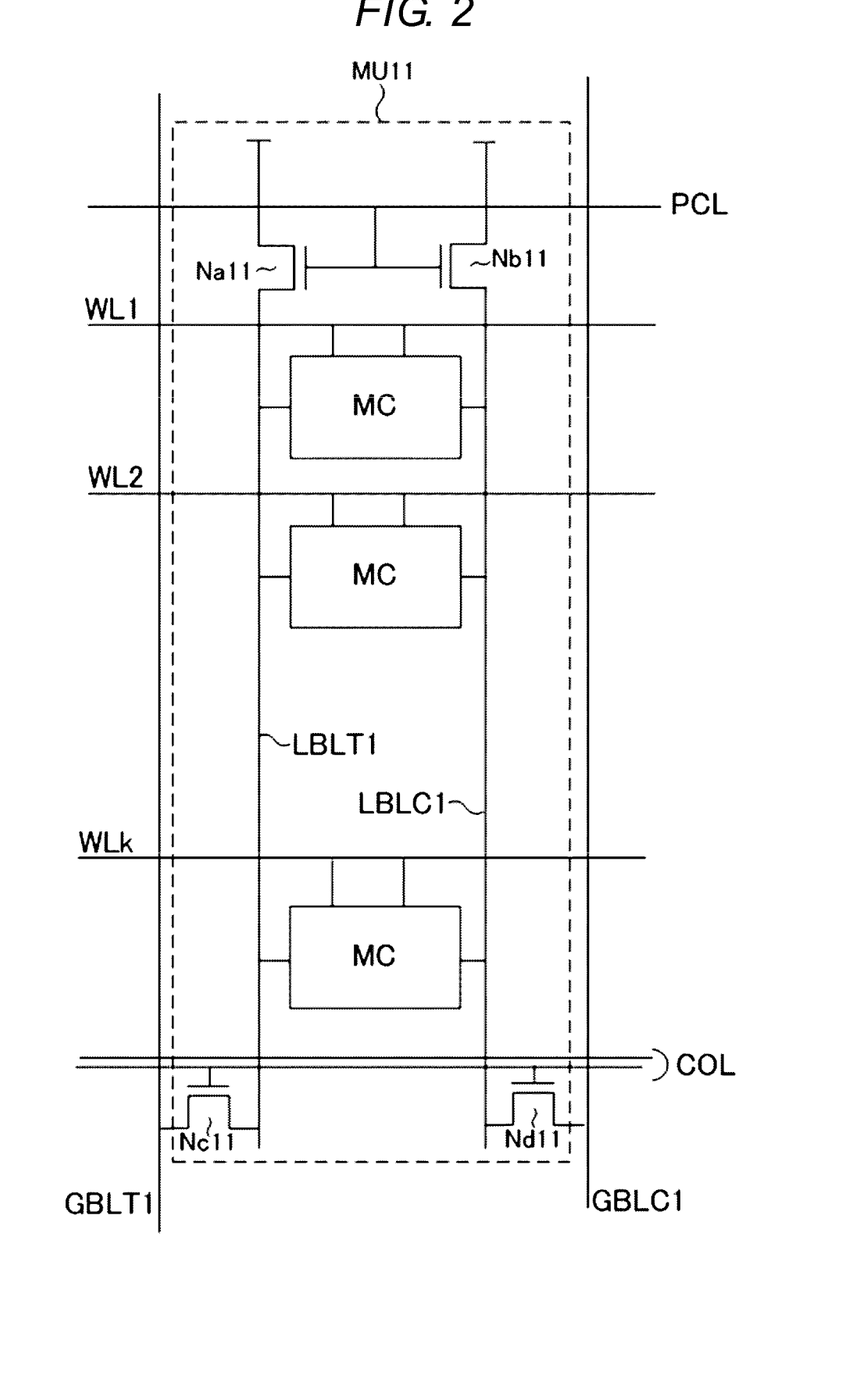
FIG. 2 is a circuit diagram depicting a memory unit according to the first embodiment.

The structure of the memory unit MU is now explained, showing the structure of the memory unit MU11 in FIG. 2 as an example. The memory units MU11 through MUxm have a same structure.

The memory unit MU11 has a plurality of memory cells MCs (e.g., SRAMs) and a plurality of N-channel-type MOS transistors Na11 through Nd11. The memory cells MCs are between a local bit line LBLT1 and a local bit line LBLC1 and connect with the local bit line LBLT1 and the local bit line LBLC1.

Each of the memory cells MCs connects to a corresponding one of word lines WL1 through WLk.

The transistors Na11 and Nb11 have the function of precharging the local bit lines LBLT1 and LBLC1. One end of the current channel of the transistor Na11 connects with a power supply VDD, while the other end of the current channel connects with one end (a first end) of the local bit line LBLT1. The gate of the transistor Na11 receives a signal PCL. Similarly, one end of the current channel of the transistor Nb11 connects with the power supply VDD, while the other end of the current channel connects with one end (a first end) of the local bit line LBLC1. The gate of the transistor Nb11 receives the signal PCL. The gates of the transistor Na11 and the transistor Nb11 are connected with each other into a common connection.

The signal PCL (also referred to as "PCL signal") in this context refers to a control signal for the pre-charge of the local bit lines LBLT and LBLC. The row decoder 40 supplies the PCL signal.

One end of the current channel of the transistor Nc11 connects with the other end (a second end) of the local bit line LBLT1, while the other end of the current channel connects with the global bit line GBLT1. The gate of the transistor Nc11 receives a signal COL. Similarly, one end of the current channel of the transistor Nd11 connects with the other end (a second end) of the local bit line LBLC1, while the other end of the current channel connects with the global bit line GBLC1. The gate of the transistor Nd11 receives the signal COL. The signal COL (also referred to as "COL signal") in this context refers to a control signal for the selection of columns. The row decoder 40 supplies the COL signal. The COL signal contains plural signals that are different for each of the columns. For simplifying the figure, the plural signals are collectively represented as "COL" in FIG. 1.

As illustrated in FIG. 1, a plurality of N-channel-type MOS transistors Ne11s and Nf11s connect between the power supply VDD and the global bit lines GBLT and GBLC. For example, one end of the current channel of the transistor Ne11 connects with the global bit line GBLT1, while the other end connects with the power supply VDD. The gate of the transistor Ne11 receives a signal PCG (also referred to as PCG signal). Similarly, one end of the current channel of the transistor Nf11 connects with the global bit line GBLC1, while the other end connects with the power supply VDD. The gate of the transistor Nf11 receives the PCG signal. The gate of the transistor Ne11 and the gate of the transistor Nf11 connect with each other into a common connection.

The PCG signal in this context refers to a control signal for the pre-charge of the global bit lines GBLT and GBLC. The PCG signal contains plural signals that are different for each of the columns to control the pre-charge of the global bit lines GBLT and GBLC for each of the columns based on the plural signals. The row decoder 40 supplies the PCG signal. For simplifying the figure, the plural signals are collectively represented as "PCG" in FIG. 1.

The memory cell MC is now explained with reference to a circuit diagram in FIG. 3.

Figure 3:
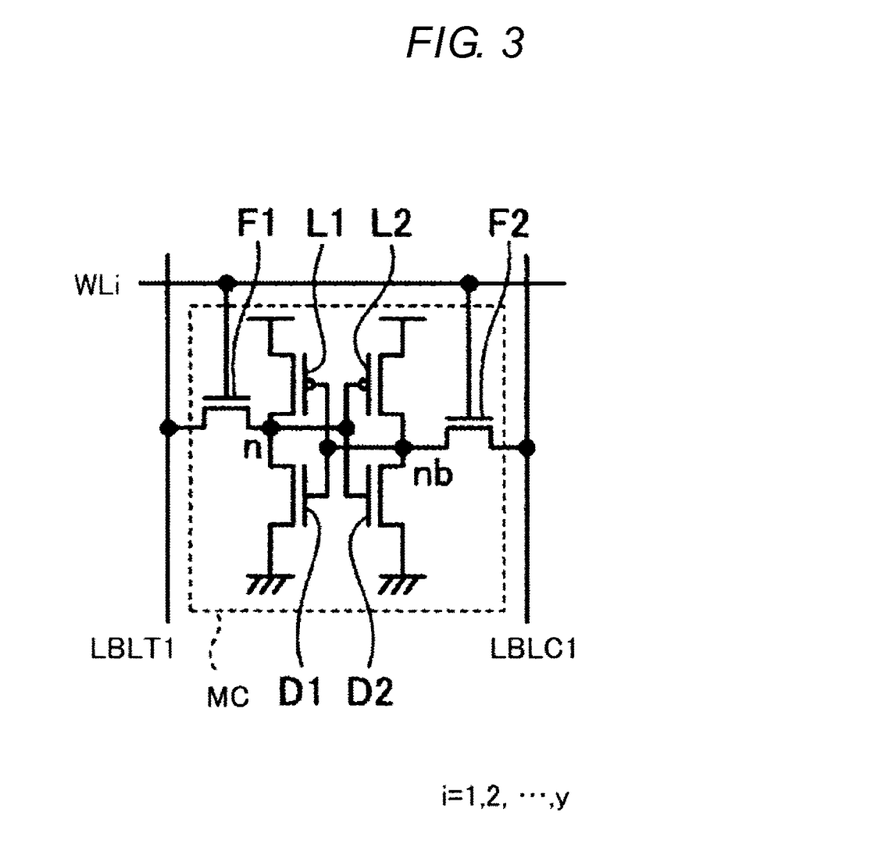
FIG. 3 is a circuit diagram depicting a memory cell according to the first embodiment.

As illustrated in FIG. 3, the memory cell MC has a pair of driving transistors D1 and D2, a pair of load transistors L1 and L2, and a pair of transmission transistors F1 and F2. The load transistors L1 and L2 are constituted by P-channel-type MOS transistors. The driving transistors D1 and D2 and the transmission transistors F1 and F2 are constituted by N-channel-type MOS transistors.

More specifically, one end of the current channel of the transmission transistor F1 connects with the local bit line LBLT1, while the other end connects with a node n. The gate of the transmission transistor F1 connects with word line WLi (i=1, 2, ... y). One end of the current channel of the load transistor L1 connects with the power supply VDD, while the other end connects with the node n. The gate of the load transistor L1 connects with a node nb. One end of the current channel of the driving transistor D1 is grounded, while the other end connects with the node n. The gate of the driving transistor D1 connects with the node nb.

One end of the current channel of the load transistor L2 connects with the power supply VDD, while the other end connects with the node nb. The gate of the load transistor L2 connects with the node n. One end of the current channel of the driving transistor D2 is grounded, while the other end connects with the node nb. The gate of the driving transistor D2 connects with the node n. One end of the transmission transistor F2 connects with the local bit line LBLC1, while the other end connects with the node nb. The gate of the transmission transistor F2 connects with the word line WLi.

Accordingly, the memory cell MC has a first CMOS inverter constituted by the series connection of the driving transistor D1 and the load transistor L1, and a second CMOS inverter constituted by the series connection of the driving transistor D2 and the load transistor L2.

<Column Selector>

The column selector 20 has the function of selecting the column direction of the memory cell array 10. More specifically, the column selector 20 selects the desired pair of global bit lines, GBLT and GBLC from the global bit lines GBLT1 through GBLTx and the GBLC1 through GBLCx.

<Sense Amplifier, Write Driver>

The sense amplifier 30 has the function of sensing the data of the memory cell MC selected via the column selector 20. More specifically, the sense amplifier 30 performs reading operation by amplifying data signals read into the selected pair of the bit lines, GBLT and GBLC.

The write driver 30 has the function of writing data into the memory cell MC selected via the column selector 20.

<Row Decoder>

The row decoder 40 has the function of selecting the desired word line WL based on the row address (Row ADD) supplied from an address buffer 70 (described below) in the data writing operation and reading operation. The row decoder 40 receives control signals S1 through S4 from the control circuit 60 (described below). The row decoder 40 selects any word line WL from the plural word lines WL, any wire from the wires supplying the COL signal, any wire from the wires supplying the PCL signal, and any wire from the wires supplying the PCG signal based on the row address and the control signals S1 through S4 to transmit desired signals.

A pre-decoder has the function of transmitting timing for driving the word line to the row decoder 40 based on the address, a chip enable signal CE, and a clock signal CK.

<Voltage Generating Circuit>

The voltage generating circuit 50 generates voltage necessary for data wiring operation and data reading operation by increasing or decreasing voltage applied from the outside.

<Control Circuit>

The control circuit 60 controls the overall operation of the semiconductor memory device 100. More specifically, the control circuit 60 performs operation sequences for data writing operations and data reading operations based on the address and command given from outside of the semiconductor memory device (such as from a controller) via a data input and output circuit (not depicted). The control circuit 60 produces a column selecting signal CSEL, a row selecting signal, and a pre-charge signal based on the address and the operation sequences.

The control circuit 60 allows the row decoder 40, the voltage generating circuit 50, and other units to generate the PCL signal, the COL signal, and the PCG signal and supply the generated signals to the memory cell array 10.

The control circuit 60 has a generating unit to generate the WL signal, the PCL signal, the COL signal, and the PCG signal, and supplies these signals to the memory cell array 10. The generating unit of the control circuit 60 is now explained with reference to the circuit diagrams in FIGS. 1 and 4. For simplification, components other than the generating unit are not shown in FIG. 4.

As illustrated in FIG. 1, the control circuit 60 outputs control signals S1 through S4 to the row decoder 40 to allow the row decoder 40 to supply the WL signal, the PCL signal, the COL signal, and the PCG signal to the memory cell array 10.

The control signal S1 is a signal for allowing supply of the WL signal to the memory cell array 10. The control signal S2 is a signal for allowing supply of the COL signal to the memory cell array 10. The control signal S3 is a signal for allowing supply of the PCG signal to the memory cell array 10. The control signal S4 is a signal for allowing supply of the PCL signal to the memory cell array 10.

Figure 4:
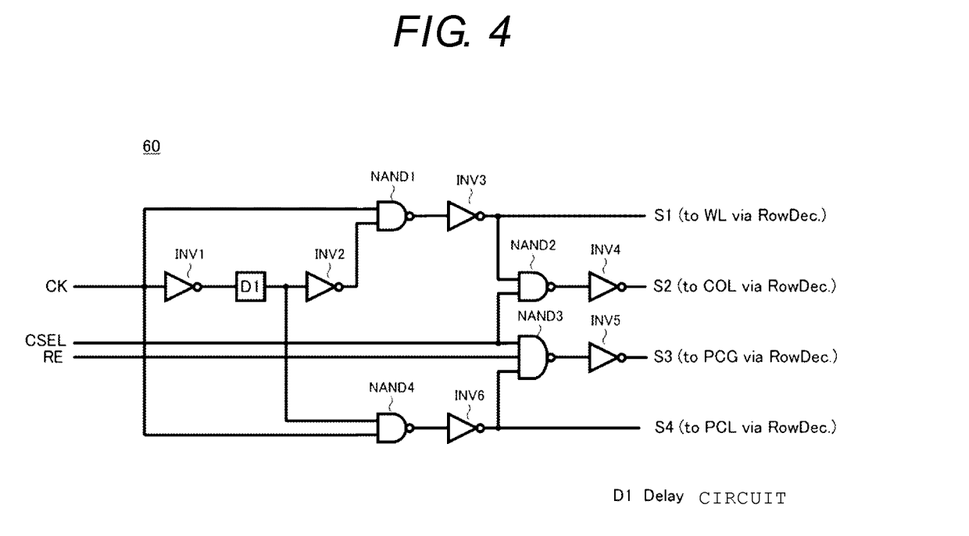
FIG. 4 is a circuit diagram depicting a portion of a control circuit according to the first embodiment.

As illustrated in FIG. 4, the control circuit 60 includes a plurality of inverters INV1 through INV6, a plurality of NAND circuits NAND1 through NAND4, and a delay circuit D1.

An input terminal of the inverter INV1 receives the clock CK. An output terminal of the inverter INV1 connects with an input terminal of the delay circuit D1. The delay circuit D1 has a structure containing a plurality of inverters, for example. An output terminal of the delay circuit D1 connects with an input terminal of the inverter INV2.

A first input terminal of the NAND circuit NAND1 receives the clock CK. A second input terminal of the NAND circuit NAND1 connects with an output terminal of the inverter INV2. An output terminal of the NAND circuit NAND1 connects with an input terminal of the inverter INV3. An output terminal of the inverter INV3 connects with the word line WL via the row decoder 40. The output terminal of the inverter INV3 also connects with a first input terminal of the NAND circuit NAND2.

A second input terminal of the NAND circuit NAND2 receives the column selecting signal CSEL. An output terminal of the NAND circuit NAND2 connects with an input terminal of the inverter INV4. An output terminal of the inverter INV4 connects with the gates of the transistors Nc and Nd via the row decoder 40. Thus, the signal outputted from the output terminal of the inverter INV4 is the COL signal.

A first input terminal of the NAND circuit NAND4 connects with the output terminal of the delay circuit D1. A second input terminal of the NAND circuit NAND4 receives the clock signal CK. An output terminal of the NAND circuit NAND4 connects with an input terminal of the inverter INV6.

A first input terminal of the NAND circuit NAND3 receives the column selecting signal CSEL, while a second input terminal of the NAND circuit NAND3 receives a read enable RE signal. A third input terminal of the NAND circuit NAND3 connects with an output terminal of the inverter INV6. The output terminal of the inverter INV6 connects with the gates of the transistors Na and Nb via the row decoder 40. Thus, the signal outputted from the output terminal of the inverter INV6 is the PCL signal.

An output terminal of the NAND circuit NAND3 connects with an input terminal of the inverter INV5. An output terminal of the inverter INV5 connects with the gates of the transistors Ne and Nf via the row decoder 40. Thus, the signal outputted from the output terminal of the inverter INV5 is the PCG signal.

<Address Buffer>

The address buffer 70 transfers address information (row address, column address and others) supplied from the outside to the column selector 20 and the row decoder 40.

[Operation Sequences of Semiconductor Memory Device]

The reading operation and writing operation performed by the semiconductor memory device according to this embodiment are now explained with reference to a timing chart in FIG. 5.

(1) Writing Operation

Figure 5:
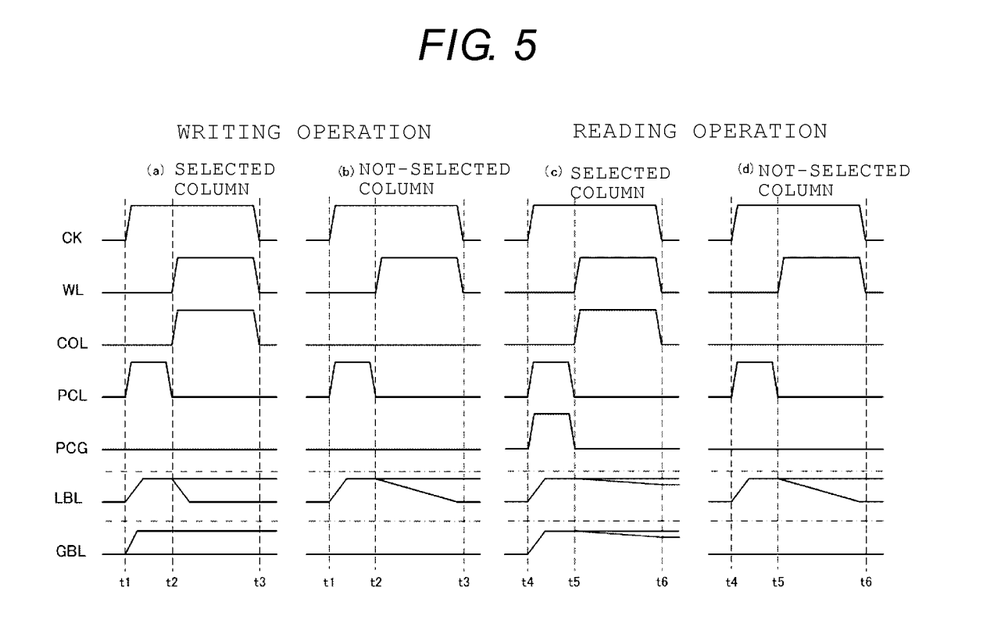
FIG. 5 is a timing chart depicting operation of the semiconductor memory device according to the first embodiment.

A chart (a) in FIG. 5 is a timing chart for the selected column in writing data to the memory cell MC, while a chart (b) in FIG. 5 is a timing chart for the not-selected column during the writing operation.

As can be seen from the charts (a) and (b) in FIG. 5, when the clock signal CK shifts to "H" level, the common PCL signal for all the columns shifts to "H" level at a time t1. The COL signal and the PCG signal remain at "L" level.

The PCL signal for all the columns shifted to "H" level turns on the transistors Na and Nb, whereby the local bit lines LBLT and LBLC are pre-charged by the power supply VDD. The electric potentials of the local bit lines LBLT and LBLC are charged up to a level of VDD-Vth1, where the voltage Vth1 corresponds to a threshold voltage of the transistors Na and Nb.

The COL signal and the PCG signal remain at "L" level, wherefore the transistors Nc, Nd, Ne, and Nf are kept turned off. As a result, the global bit lines GBLT and GBLC remain at a floating electric potential.

At a time t2, the selected word line WL shifts to "H" level, and the COL signal for the selected column shifts to "H" level. The COL signal for the not-selected column remains at "L" level. The PCL signal shifts to "L" level. The PCG signal remains at "L" level.

The PCL signal shifts to "L" level and ends the pre-charge of the local bit lines LBLT and LBLC.

The condition of only the COL signal for the selected column shifted to "H" level produces continuity (that is, an electric connection) between the write driver 30 and the local bit lines LBLT and LBLC of the selected column. Also, the word line WL shifted to "H" level initiates data transfer from the write driver 30 to the memory cell MC.

With the COL signal for the not-selected column remaining at "L" level, no continuity is produced between the write driver 30 and the local bit lines LBLT and LBLC of the not-selected column, wherefore the local bit lines LBLT and LBLC are floating after the end of the pre-charge.

After the end of the data transfer at a time t3, the clock signal CK, the word line WL, and the COL signal for the selected column shift to "L" level, and thereby complete the data writing operation.

(2) Reading Operation

A chart (c) in FIG. 5 is a timing chart for the selected column in reading data from the memory cell MC. A chart (d) in FIG. 5 is a timing chart for the not-selected column during the reading operation.

As can be seen from the charts (c) and (d) in FIG. 5, the clock signal CK shifts to "H" level, and the common PCL signal for all the columns shifts to "H" level at a time t4. The COL signal remains at "L" level. The PCG signal for the selected column shifts to "H" level, while the PCG signal for the not-selected column remains at "L" level.

The PCL signal for all the columns shifted to "H" level turns on the transistors Na and Nb, whereby the local bit lines LBLT and LBLC are pre-charged by the power supply VDD. The electric potentials of the local bit lines LBLT and LBLC are charged up to a level of VDD-Vth1, where the voltage Vth1 is a threshold voltage of the transistors Na and Nb.

The COL signal remains at "L" level, wherefore the transistors Nc and Nd remain in the OFF condition. The PCG signal for the selected column shifted to "H" level turns on the transistors Ne and Nf, whereby the global bit lines GBLT and GBLC of the selected column are charged up to a level of VDD-Vth2, where the voltage Vth2 refers to a threshold voltage of the transistors Ne and Nf.

The global bit lines GBLT and GBLC of the selected column are pre-charged for the following reason. When the global bit lines GBLT and GBLC are floating, erroneous data reading from the memory cell MC may occur in accordance with the floating electric potentials of the global bit lines GBLT and GBLC. Thus, the global bit lines GBLT and GBLC of the selected column are pre-charged for avoiding this erroneous reading.

The global bit lines GBLT and GBLC of the not-selected column are kept floating.

At a time t5, the selected word line WL shifts to "H" level, and the COL signal for the selected column shifts to "H" level. The COL signal for the not-selected column remains at "L" level. The PCL signal shifts to "L" level. The PCG signal shifts to "L" level.

The PCL signal shifts to "L" level and ends the pre-charge of the local bit lines LBLT and LBLC. The PCG signal shifts to "L" level and ends the pre-charge of the global bit lines GBLT and GBLC.

The condition of only the COL signal for the selected column shifted to "H" level produces continuity between the sense amplifier 30 and the local bit lines LBLT and LBLC of the selected column. Also, the word line WL shifted to "H" level initiates data transfer from the memory cell MC to the sense amplifier 30.

With the COL signal for the not-selected column remaining at "L" level, no continuity is produced between the sense amplifier 30 and the local bit lines LBLT and LBLC of the not-selected column. Thus, the local bit lines LBLT and LBLC are floating after the end of the pre-charge.

After the end of the data transfer at a time t6, the clock signal CK, the word line WL, and the COL signal for the selected column shift to "L" level, and thereby complete the data reading operation.

[Advantage of First Embodiment]

Accordingly, this embodiment can provide a semiconductor memory device capable of reducing power consumption. This advantage is now specifically described. The advantage of the semiconductor memory device according to this embodiment is herein discussed in comparison with a semiconductor memory device according to a comparison example shown in FIGS. 6 and 7.

Figure 6:
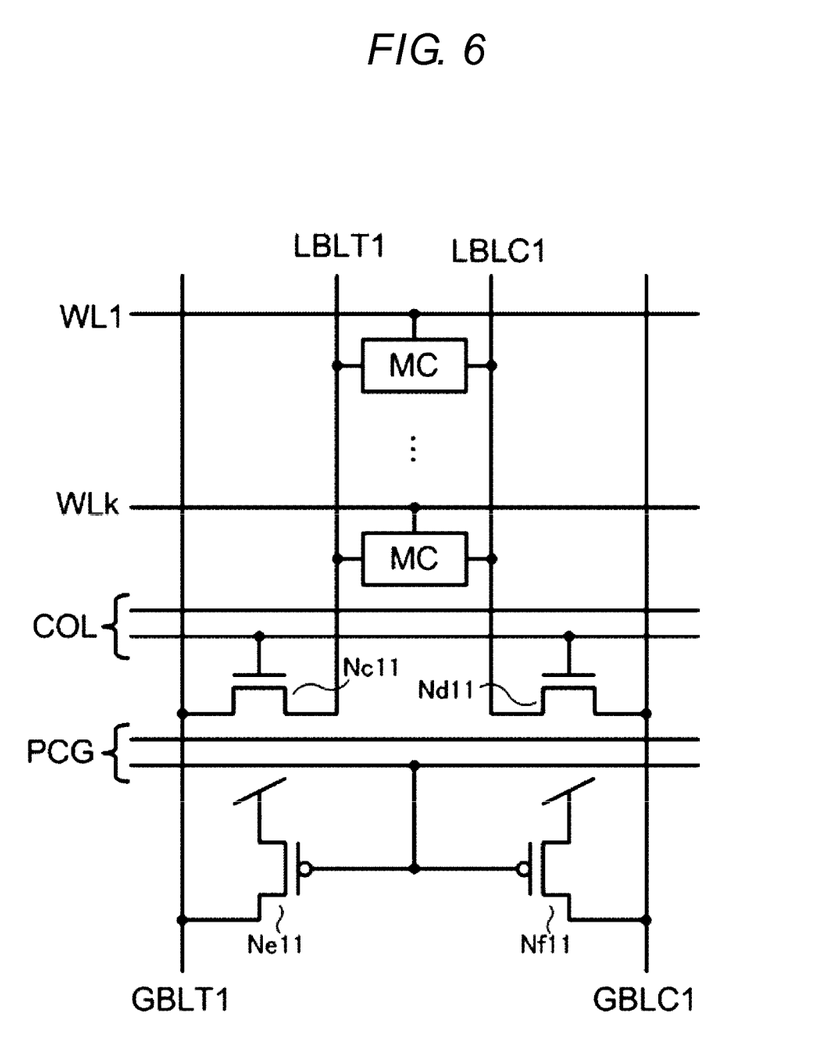
FIG. 6 is a circuit diagram showing a memory unit according to a comparison example.
Figure 7:
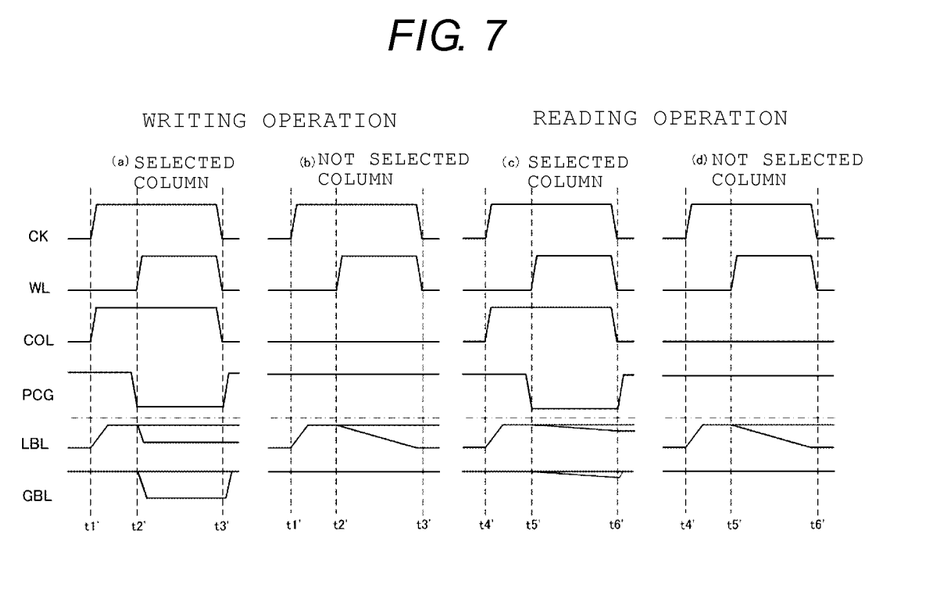
FIG. 7 is a timing chart illustrating the operation of the semiconductor memory device according to the comparison example.

As illustrated in FIGS. 6 and 7, the semiconductor memory device in a comparison example does not have the transistors Na and Nb. Thus, the local bit lines LBLT and LBLC need to be pre-charged via the global bit lines GBLT and GBLC at the time of pre-charge of the local bit lines LBLT and LBLC. For the load capacities of the global bit lines GBLT and GBLC, the wiring capacities are dominant factors. Thus, the ratio of the load capacities of the global bit lines GBLT and GBLC to the load capacities of the local bit lines LBLT and LBLC increases as the number of the memory cells MC within the memory cell array 10 increases.

According to this first embodiment, however, the transistors Na and Nb allow pre-charge of the local bit lines LBLT and LBLC without using the global bit lines GBLT and GBLC. In this case, excessive charging of the load capacities of the global bit lines GBLT and GBLC is not required, wherefore the power consumption of the semiconductor memory device in this embodiment becomes lower than the power consumption in the comparison example (see FIG. 8B).

Figure 8A:
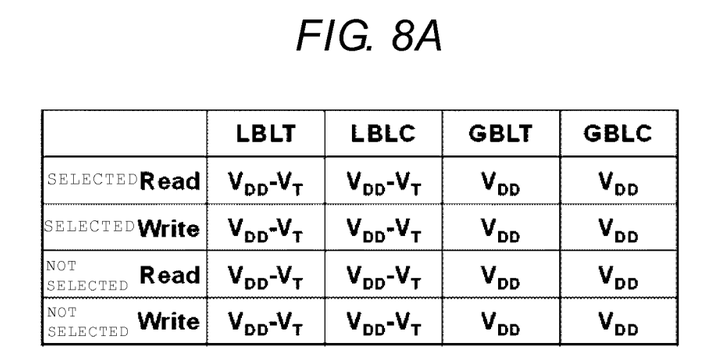
FIG. 8A is a table of voltages applied to local bit lines and global bit lines during operation in the comparison example.

According to the comparison example, transistors corresponding to the transistors Ne and Nf in the first embodiment are constituted by P-channel-type MOS transistors. Thus, the global bit lines GBLT and GBLC in the comparison example are pre-charged by the voltage VDD (see FIG. 8A).

Figure 8B:
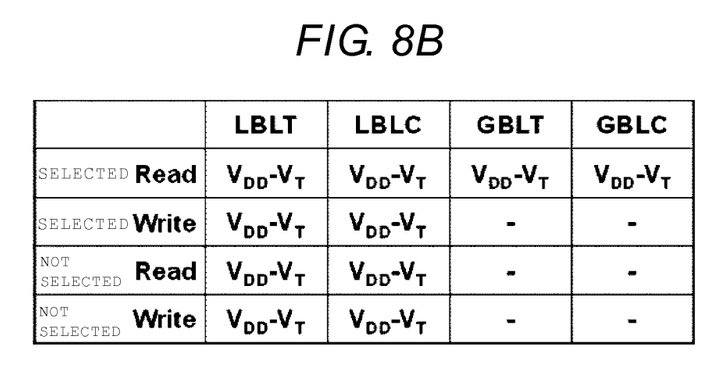
FIG. 8B is a table depicting voltages applied to the local bit lines and the global bit lines during operation in the first embodiment.

However, the transistors Ne and Nf in the first embodiment are constituted by N-channel-type MOS transistors, wherefore the global bit line GBLT and GBLC are pre-charged by the voltage VDD-Vth2 and pre-charged only at the time of the reading operation for the global bit lines of the selected column (see FIG. 8B). Accordingly, the power consumption in this first embodiment becomes further lower than the power consumption in the comparison example by the difference of the voltage Vth2.

(Second Embodiment)

A semiconductor memory device according to a second embodiment is hereinafter described with reference to FIG. 9 through FIG. 12.

[Structure of Semiconductor Memory Device in Second Embodiment]

The semiconductor memory device according to the second embodiment is different from the semiconductor memory device in the first embodiment in that distinctions are made between the PCL signals for the respective columns, and that the control circuit 60 having a different structure to deal with the plural PCL signals is equipped. Other structures are similar to the corresponding structures in the first embodiment, and the same detailed description is not repeated.

<Memory Unit MU>

Figure 9:
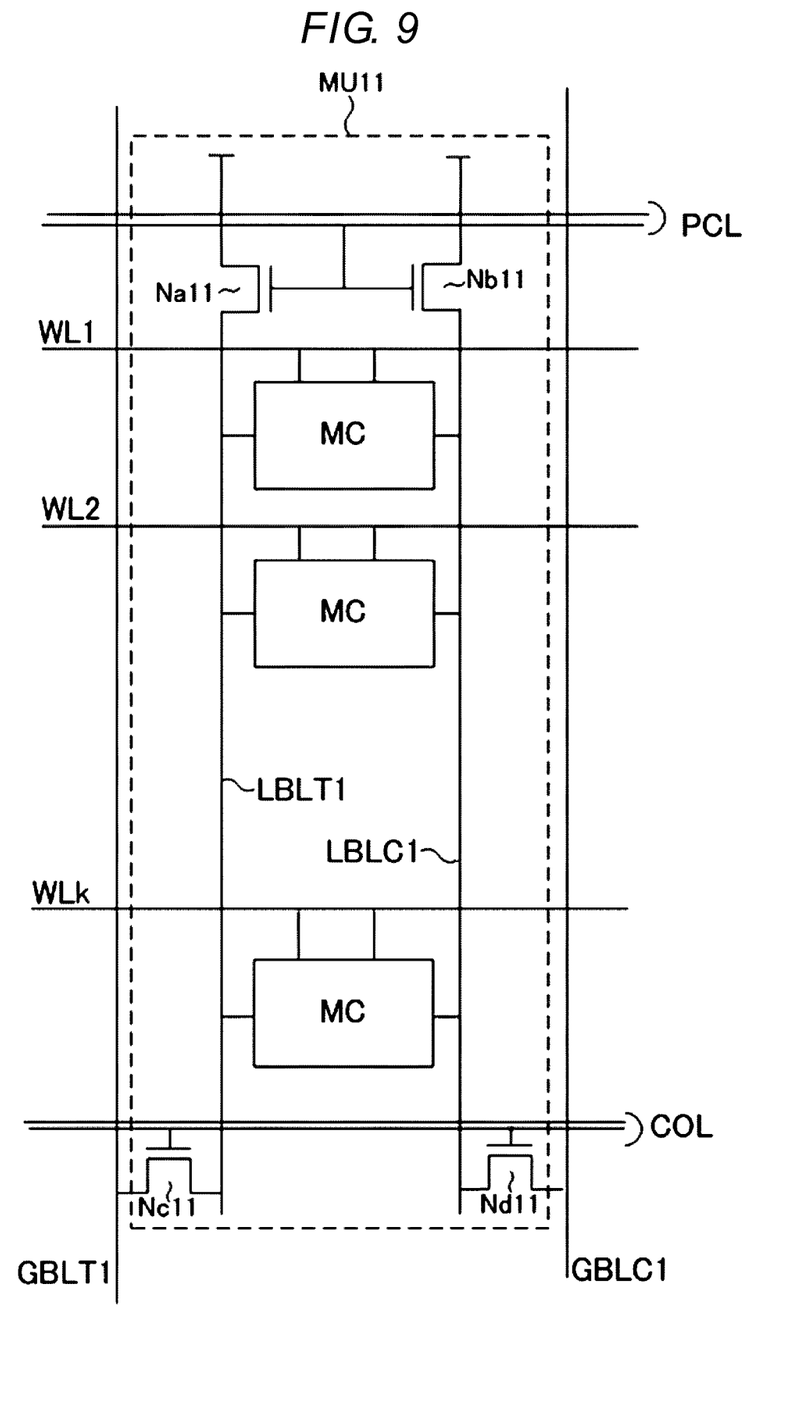
FIG. 9 is a circuit diagram depicting a memory unit according to a second embodiment.

As illustrated in FIG. 9, the memory unit MU is different from the corresponding component of the semiconductor memory device according to the first embodiment in that the wire for supplying the PCL signal is provided for each of the columns. More specifically, the PCL signal contains a plurality of signals to control the pre-charge of the local bit lines LBLT and LBLC for each of the columns based on the signals.

<Control Circuit 60>

Figure 10:
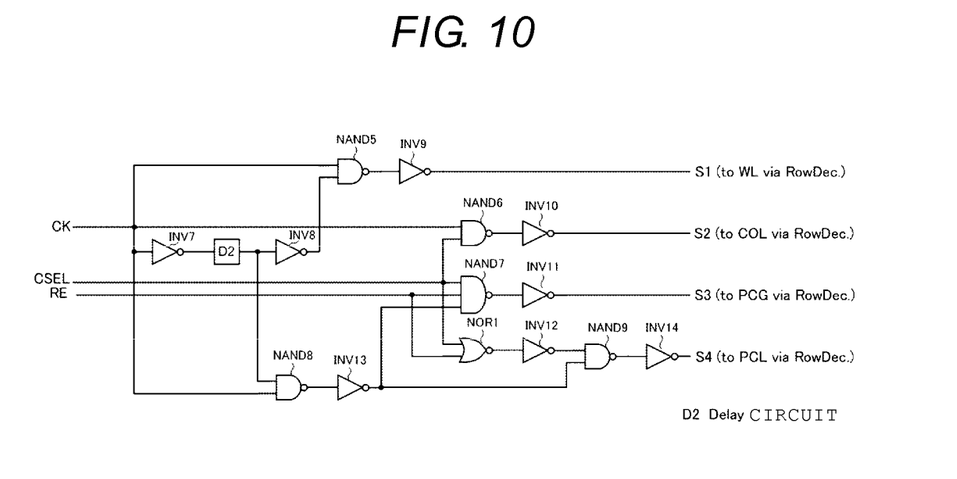
FIG. 10 is a circuit diagram depicting a portion of a control circuit according to the second embodiment.

As illustrated in FIG. 10, the control circuit 60 according to the second embodiment has a structure different from the first embodiment.

As can be seen from FIG. 10, the control circuit 60 contains a plurality of inverters INV7 through INV14, NAND circuits NAND5 through NAND9, an NOR circuit NOR1, and a delay circuit D2.

An input terminal of the inverter INV7 receives the clock CK. An output terminal of the inverter INV7 connects with an input terminal of the delay circuit D2. The delay circuit D2 has a structure containing a plurality of inverters, for example. An output terminal of the delay circuit D2 connects with an input terminal of the inverter INV8.

A first input terminal of the NAND circuit NAND5 receives the clock signal CK. A second input terminal of the NAND circuit NAND5 connects with an output terminal of the inverter INV8. An output terminal of the NAND circuit NAND5 connects with an input terminal of the inverter INV9. An output terminal of the inverter INV9 connects with the word line WL via the row decoder 40.

A first input terminal of the NAND circuit NAND6 receives the clock signal CK. A second input terminal of the NAND circuit NAND6 receives the column selecting signal CSEL. An output terminal of the NAND circuit NAND6 connects with an input terminal of the inverter INV10. An output terminal of the inverter INV10 connects with the gates of the transistors Nc and Nd via the row decoder 40. Thus, the signal outputted from the output terminal of the inverter INV10 is the COL signal.

A first input terminal of the NAND circuit NAND8 connects with an output terminal of the delay circuit D2, while a second input terminal of the NAND circuit NAND8 receives the clock signal CK. An output terminal of the NAND circuit NAND8 connects with an input terminal of the inverter INV13.

A first input terminal of the NAND circuit NAND7 receives the column selecting signal CSEL. A second input terminal of the NAND circuit NAND7 receives a read enable signal RE. A third input terminal of the NAND circuit NAND7 connects with an output terminal of the inverter INV13.

An output terminal of the NAND circuit NAND7 connects with an input terminal of the inverter INV11. An output terminal of the inverter INV11 connects with the gates of the transistors Ne and Nf via the row decoder 40. Thus, the signal outputted from the output terminal of the inverter INV11 is the PCG signal.

A first input terminal of the NOR circuit NOR1 receives the column selecting signal CSEL. A second input terminal of the NOR circuit NOR1 receives the read enable signal RE. An output terminal of the NOR circuit NOR1 connects with an input terminal of the inverter INV12. An output terminal of the inverter INV12 connects with a first input terminal of the NAND circuit NAND9.

A second input terminal of the NAND circuit NAND9 connects with an output terminal of the inverter INV13. An output terminal of the NAND circuit NAND9 connects with an input terminal of the inverter INV14. An output terminal of the inverter INV14 connects with the gates of the transistors Na and Nb via the row decoder 40. Thus, the signal outputted from the output terminal of the inverter INV14 is the PCL signal.

The output terminals of the inverter INV14 are differentiated between the respective columns. The PCL signals are supplied to the memory cell array 10 individually for each of the columns.

[Operation Sequences of Semiconductor Memory Device in Second Embodiment]

Reading operation and writing operation of the semiconductor memory device according to this embodiment are hereinafter described with reference to the timing charts in FIG. 11.

(1) Writing Operation

Figure 11:
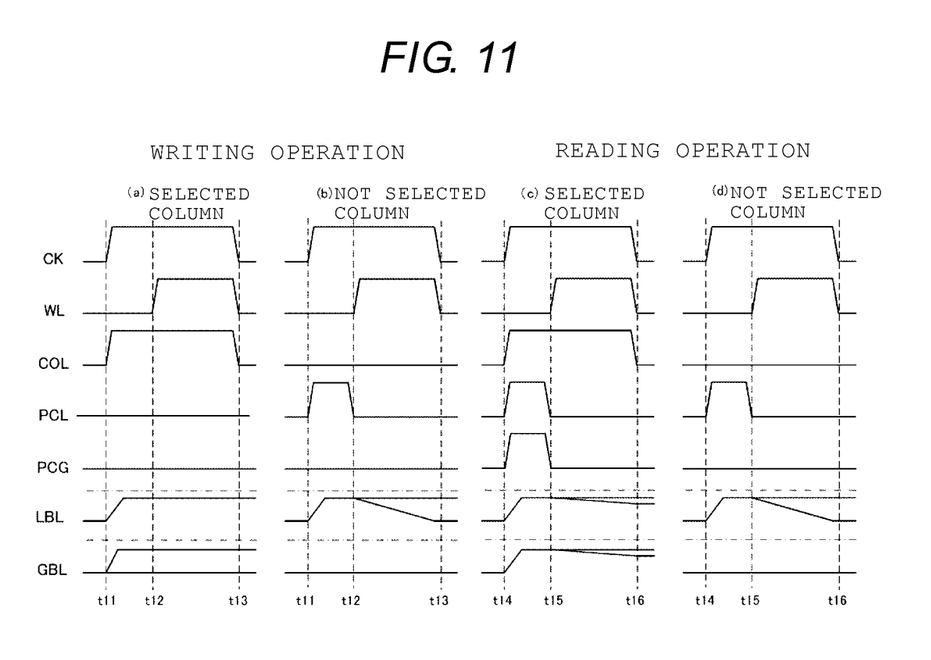
FIG. 11 is a timing chart depicting operation of the semiconductor memory device according to the second embodiment.

A chart (a) in FIG. 11 shows a timing chart for the selected column in writing data to the memory cell MC, while a chart (b) in FIG. 11 shows a timing chart for the not-selected column during the writing operation.

As illustrated in the charts (a) and (b) in FIG. 11, the clock signal CK shifts to "H" level, and the COL signal for the selected column shifts to "H" level at a time t11. The COL signal for the not-selected column remains at "L" level. The PCL signal of the selected column remains at "L" level, and the PCL signal for the not-selected column shifts to "H" level. The PCG signal remains at "L" level.

The condition of the PCL signal for the selected column remaining at "L" level and the PCL signal for the not-selected column shifted to "H" level turns off the transistors Na and Nb of the selected column, wherefore the local bit lines LBLT and LBLC are floating.

On the other hand, the transistors Na and Nb of the not-selected column are turned on, wherefore the local bit lines LBLT and LBLC are pre-charged by the power supply VDD. The electric potentials of the local bit lines LBLT and LBLC are charged up to a level of VDD-Vth1, where the voltage Vth1 corresponds to the threshold voltage of the transistors Na and Nb.

The COL signal for the selected column is at "H" level, and the transistors Nc and Nd are in the ON condition (that is, the current channel is made conductive). In this case, continuity (an electrical connection) is produced between the write driver 30 and the local bit lines LBLT and LBLC of the selected column. The COL signal for the not-selected column remains at "L" level, and the transistors Nc and Nd remain in the OFF condition.

The PCG signal remains at "L" level, and the transistors Ne and Nf remain in the OFF condition. Accordingly, the global bit lines GBLT and GBLC are kept floating.

At a time t12, the selected word line WL shifts to "H" level, and the COL signal for the selected column remains at "H" level. The COL signal for the not-selected column remains at "L" level. The PCL signal for the selected column remains at "L" level, and the PCL signal for the not-selected column shifts to "L" level. The PCG signal remains at "L" level.

The PCL signal for the not-selected signal shifts to "L" level and ends the pre-charge of the local bit lines LBLT and LBLC of the not-selected column.

The word line WL shifted to "H" level initiates data transfer from the write driver 30 to the memory cell MC.

The COL signal for the not-selected column remaining at "L" level prevents continuity between the write driver 30 and the local bit lines LBLT and LBLC of the not-selected column. Thus, the local bit lines LBLT and LBLC are floating after the end of the pre-charge of the local bit lines LBLT and LBLC.

After the end of the data transfer at a time t13, the clock signal CK, the word line WL, and the COL signal for the selected column shift to "L" level, and thereby complete the data writing operation.

(2) Reading Operation

A chart (c) in FIG. 11 shows a timing chart for the selected column in reading data from the memory cell MC, while a chart (d) in FIG. 11 shows a timing chart for the not-selected column during the reading operation.

As shown in the charts (c) and (d) in FIG. 11, the clock signal shifts to "H" level, and the PCL signal shifts to "H" level at a time t14. The COL signal for the selected column shifts to "H" level, while the COL signal for the not-selected column remains at "L" level. The PCG signal for the selected column shifts to "H" level, while the PCG signal for the not-selected column remains at "L" level.

The PCL signals for all the columns shifted to "H" level turn on the transistors Na and Nb, whereby the local bit lines LBLT and LBLC are pre-charged by the power supply VDD. The electric potentials of the local bit lines LBLT and LBLC are charged up to the level of VDD-Vth1, where the voltage Vth1 corresponds to the threshold voltage of the transistors Na and Nb.

The COL signal for the selected column is at "H" level, and the transistors Nc and Nd are in the ON condition. In this case, continuity is produced between the sense amplifier 30 and the local bit lines LBLT and LBLC of the selected column. The COL signal for the not-selected column remains at "L" level, and the transistors Nc and Nd remain in the OFF condition.

The PCG signal for the selected column shifted to "H" level turns on the transistors Ne and Nf, wherefore the global bit lines GBLT and GBLC of the selected column are charged up to VDD-Vth2. The voltage Vth2 corresponds to the threshold voltage of the transistors Ne and Nf. The global bit lines GBLT and GBLC of the selected column are pre-charged for the following reason. When the global bit lines GBLT and GBLC are floating, erroneous data reading of the memory cell MC may occur in accordance with the electric potentials of the global bit lines GBLT and GBLC. The global bit lines GBLT and GBLC of the selected column are pre-charged for preventing this erroneous reading.

The global bit lines GBLT and GBLC of the not-selected column remain floating.

At a time t15, the selected word line WL shifts to "H" level. The COL signal for the selected column remains at "H" level, while the COL signal for the not-selected column remains at "L" level. The PCL signal shifts to "L" level. The PCG signal shifts to "L" level.

The PCL signal shifts to "L" level and ends the pre-charge of the local bit lines LBLT and LBLC. The PCG signal shifts to "L" level and ends the pre-charge of the global bit lines GBLT and GBLC.

The condition of only the COL signal for the selected column remaining at "H" level produces continuity between the sense amplifier 30 and the local bit lines LBLT and LBLC of the selected column. The word line WL shifted to "H" level initiates data transfer from the memory cell MC to the sense amplifier 30.

The condition of the COL signal for the not-selected column remaining at "L" level prevents continuity between the sense amplifier 30 and the local bit lines LBLT and LBLC of the not-selected column. In this case, the local bit lines LBLT and LBLC are floating after the end of the pre-charge of the local bit lines LBLT and LBLC.

After the data transfer ends at a time t16, the clock signal CK, the word line WL, and the COL signal for the selected column shift to "L" level, and thereby complete the data reading operation.

[Advantage of Second Embodiment]

Accordingly, this second embodiment can provide a semiconductor memory device capable of reducing the power consumption similarly to the first embodiment.

Figure 12:
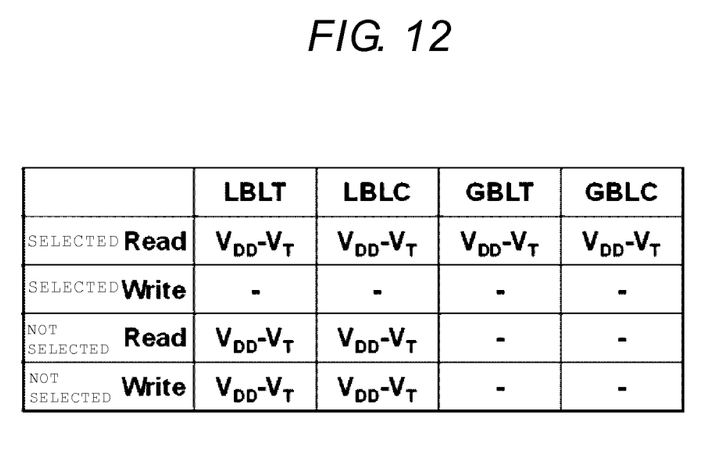
FIG. 12 is a table depicting voltages applied to the local bit lines and the global bit lines during operation in the second embodiment.

Moreover, the semiconductor memory device according to this second embodiment does not pre-charge the local bit lines LBLT and LBLC of the selected column during the writing operation (FIG. 12). Thus, the semiconductor memory device in this second embodiment can decrease the power consumption more than the device in the first embodiment by eliminating the necessity of pre-charging the local bit lines LBLT and LBLC of the selected column during the writing operation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a memory cell in a column of memory cells;
a first local bit line connected to the memory cell;
a second local bit line connected to the memory cell;
a first transistor with a current channel having a first end connected to a power supply voltage and a second end connected to the first local bit line;
a second transistor with a current channel having a first end connected to the power supply voltage and a second end connected to the second local bit line, a gate of the first transistor electrically connected to a gate of the second transistor;
a third transistor with a current channel having a first end connected to the first local bit line and a second end connected to a first global bit line;
a fourth transistor with a current channel having a first end connected to the second local bit line and a second end connected to a second global bit line, a gate of the third transistor electrically connected to a gate of the fourth transistor;
a fifth transistor with a current channel having a first end connected to the first global bit line and a second end connected to the power supply voltage;
a sixth transistor with a current channel having a first end connected to the second global bit line and a second end connected to the power supply voltage, a gate of the fifth transistor electrically connected to a gate of the sixth transistor; and
a control unit configured to supply control signals for controlling the first through sixth transistors during a data writing operation of a selected column and a data reading operation of a selected column, wherein
the control unit is configured to provide, during the data reading operation, control signals to turn on the first and second transistors and turn off the fifth and sixth transistors when the column is a non-selected column of the data reading operation.

2. The device according to claim 1, wherein the control unit is configured to provide, during the data writing operation, control signals to turn on the first and second transistors and turn off the third and fourth transistors for pre-charging the first and second local bit lines when the column is the selected column of the data writing operation and when the column is a non-selected column of the data writing operation.

3. The device according to claim 1, wherein the control unit is configured to provide, during the data reading operation, control signals to turn on the first and second transistors and to turn on the fifth and sixth transistors to pre-charge the first and second local bit lines when the column is the selected column of the data reading operation.

4. The device according to claim 1, wherein the control unit is configured to provide, during the data writing operation, control signals to turn on the third and fourth transistors and turn off the first, second, fifth, and sixth transistors for pre-charging the first and second local bit lines when the column is the selected column of the data writing operation and not to provide control signals to turn on the third and fourth transistors and turn off the first, second, fifth, and sixth transistors for pre-charging the first and second local bit lines when the column is a non-selected column of the data writing operation.

5. The device according to claim 1, wherein the memory cell is a volatile memory cell.

6. The device according to claim 1, wherein the fifth and sixth transistors are n-channel-type metal oxide semiconductor transistors.

7. The device according to claim 1, the control unit configured to provide four control signals based on a clock signal, a column select signal, and a read enable signal.

8. The device according to claim 7, the control unit comprising:
a first inverter receiving the clock signal as an input signal;
a delay circuit receiving an output of the first inverter;
a second inverter receiving an output of the delay circuit;
a first NAND circuit receiving the clock signal at a first input terminal and an output of the second inverter at a second input terminal;
a third inverter receiving an output of the first NAND circuit and outputting a first control signal;
a second NAND circuit receiving the first control signal at a first input terminal and the column select signal at a second input terminal;

a fourth inverter receiving an output of the second NAND circuit and outputting a second control signal;
a fourth NAND circuit receiving the output of the delay circuit at a first input terminal and the clock signal at a second input terminal;
a sixth inverter receiving an output of the fourth NAND circuit and outputting a fourth control signal;
a third NAND circuit receiving the column select signal at a first input terminal, the read enable signal at a second input terminal, and the fourth control signal at a third input terminal; and
a fifth inverter receiving an output of the third NAND circuit and outputting a third control signal.

9. A semiconductor memory device comprising:
a first column of memory units and a second column of memory units, each column of memory units having:
a first transistor with a current channel having a first end connected to a power supply voltage, and a second end connected to a first local bit line in a memory unit;
a second transistor with a current channel having a first end connected to the power supply voltage and a second end connected to a second local bit line in the memory unit, a gate of the first transistor electrically connected to a gate of the second transistor;
a third transistor with a current channel having a first end connected to the first local bit line and a second end connected to a first global bit line;
a fourth transistor with a current channel having a first end connected to the second local bit line and a second end connected to a second global bit line, a gate of the third transistor electrically connected to a gate of the fourth transistor;
a fifth transistor with a current channel having a first end connected to the first global bit line and a second end connected to the power supply voltage; and
a sixth transistor with a current channel having a first end connected to the second global bit line and a second end connected to the power supply voltage, a gate of the fifth transistor electrically connected to a gate of the sixth transistor; and
a control unit configured to supply control signals for controlling the first through sixth transistors in the first column separately from the first through sixth transistors in the second column.

10. The device according to claim 9, wherein the control unit turns on the first and second transistors for the first and second columns and turns off the fifth and sixth transistors for the first and second columns to pre-charge of the first and second local bit lines during a data writing operation in which the first column is a selected column; and
the control unit turns on the first and second transistors for the second column and turns off the fifth and sixth transistors for the second column to pre-charge the first and second local bit lines of the second column during a data reading operation in which the first column is a selected column.

11. The device according to claim 10, wherein the control unit turns on the first and second transistors for the first column and turns on the fifth and sixth transistors for the first column to pre-charge the first and second local bit lines of the first column during the data reading operation in which the first column is the selected column.

12. The device according to claim 9, wherein the control unit turns on the third and fourth transistors for the first column and turns off the first and second transistors for the first column, and turns off the fifth and sixth transistor for the first column to pre-charge the first and second local bit lines of the first column during a data writing operation in which the first column is a selected column.

13. The device according to claim 9, wherein the memory units are comprised of a plurality of volatile memory cells.

14. The device according to claim 13, wherein the volatile memory cell is a static random access memory (SRAM) cell.

15. The device according to claim 9, wherein the fifth and sixth transistors are n-channel-type metal oxide semiconductor transistors.

16. The device according to claim 9, wherein the control unit is configured to control a pre-charge of the first and second bit lines for each column separately.

17. A semiconductor memory device, comprising:
a plurality of memory units disposed in a first column and a second column, each column having respectively:
a first global bit line connected to each memory unit in the column, and
a second global bit line connected to each memory unit in the column;
each memory unit comprising:
a plurality of memory cells;
a first local bit line connected to each memory cell in the memory unit;
a second local bit line connected to each memory cell in the memory unit;
a first transistor with a current channel having a first end connected to a power supply voltage, and a second end connected to the first local bit line;
a second transistor with a current channel having a first end connected to the power supply voltage and a second end connected to the second local bit line, a gate of the first transistor electrically connected to a gate of the second transistor;
a third transistor with a current channel having a first end connected to the first local bit line and a second end connected to the first global bit line of the respective column; and
a fourth transistor with a current channel having a first end connected to the second local bit line and a second end connected to the second global bit line of the respective column, a gate of the third transistor electrically connected to a gate of the fourth transistor;
a fifth transistor with a current channel having a first end connected to the first global bit line of the respective column and a second end connected to the power supply voltage; and
a sixth transistor with a current channel having a first end connected to the second global bit line of the respective column and a second end connected to the power supply voltage, a gate of the fifth transistor electrically connected to a gate of the sixth transistor; and
a control unit configured to supply control signals to the gates of the first through sixth transistors separately for each of the first and second columns to control data reading and data writing operations.

18. The semiconductor memory device of claim 17, wherein the fifth transistor and sixth transistor of each of the first and second columns are connected to the control unit with different control lines which are separately controlled by the control unit.

19. The device according to claim 17, wherein the fifth and sixth transistors are n-channel-type metal oxide semiconductor transistors.

* * * * *